(12) United States Patent　　(10) Patent No.: US 11,686,868 B2
Sugiyama et al.　　(45) Date of Patent: Jun. 27, 2023

(54) EARTHQUAKE ESTIMATION METHOD, NON-TRANSITORY COMPUTER READABLE MEDIUM, AND EARTHQUAKE ESTIMATION DEVICE

(71) Applicant: JAPAN AGENCY FOR MARINE-EARTH SCIENCE AND TECHNOLOGY, Yokosuka (JP)

(72) Inventors: Daisuke Sugiyama, Yokosuka (JP); Seiji Tsuboi, Yokosuka (JP)

(73) Assignee: JAPAN AGENCY FOR MARINE-EARTH SCIENCE AND TECHNOLOGY, Yokosuka (JP)

( * ) Notice: Subject to any disclaimer, the term of this patent is extended or adjusted under 35 U.S.C. 154(b) by 71 days.

(21) Appl. No.: 17/442,190

(22) PCT Filed: Mar. 19, 2020

(86) PCT No.: PCT/JP2020/012370
§ 371 (c)(1),
(2) Date: Sep. 23, 2021

(87) PCT Pub. No.: WO2020/196292
PCT Pub. Date: Oct. 1, 2020

(65) Prior Publication Data
US 2022/0187483 A1　Jun. 16, 2022

(30) Foreign Application Priority Data
Mar. 26, 2019　(JP) ................................. 2019-058318

(51) Int. Cl.
*G01V 1/00*　(2006.01)
*G01V 1/28*　(2006.01)
(Continued)

(52) U.S. Cl.
CPC .............. *G01V 1/008* (2013.01); *G01V 1/282* (2013.01); *G01V 1/307* (2013.01); *G06F 30/20* (2020.01); *G06N 20/00* (2019.01)

(58) Field of Classification Search
CPC ........ G01V 1/008; G01V 1/282; G01V 1/307; G06N 20/00; G06F 30/20
See application file for complete search history.

(56) References Cited

U.S. PATENT DOCUMENTS

| 7,277,797 | B1 * | 10/2007 | Kunitsyn | G01V 1/008 |
| | | | | 702/15 |
| 8,699,298 | B1 * | 4/2014 | Sheng | G01V 1/364 |
| | | | | 367/73 |
| 10,163,218 | B2 * | 12/2018 | Nakagawa | G06T 7/246 |

FOREIGN PATENT DOCUMENTS

| JP | H08-95950 A | 4/1996 |
| JP | H11-64553 A | 3/1999 |

(Continued)

OTHER PUBLICATIONS

Jun. 2, 2020 International Search Report issued in International Patent Application No. PCT/JP2020/012370.

*Primary Examiner* — Elias Desta
(74) *Attorney, Agent, or Firm* — Oliff PLC

(57) ABSTRACT

An earthquake estimation method for more promptly estimating an earthquake on the basis of observation data. The earthquake estimation method includes, by a computer: generating an observation image showing a spatial distribution of seismic wave propagation on a basis of an observation result of seismic waves at a plurality of observation points on a ground; and estimating a parameter of an earthquake with respect to the observation image by using an earthquake estimation model in which a parameter of an earthquake including at least a position of a hypocenter and a magnitude is associated with a simulated observation (Continued)

image showing a spatial distribution of seismic wave propagation on a ground obtained from a result of a numerical simulation of the earthquake, performed with the parameter.

8 Claims, 7 Drawing Sheets

(51) Int. Cl.
    *G01V 1/30*     (2006.01)
    *G06N 20/00*     (2019.01)
    *G06F 30/20*     (2020.01)

(56) References Cited

FOREIGN PATENT DOCUMENTS

| | | |
|---|---|---|
| JP | 2002-122675 A | 4/2002 |
| JP | 2006-105862 A | 4/2006 |
| JP | 2018-136247 A | 8/2018 |
| WO | 2018/008708 A1 | 1/2018 |

\* cited by examiner

EARTHQUAKE ESTIMATION METHOD, NON-TRANSITORY COMPUTER READABLE MEDIUM, AND EARTHQUAKE ESTIMATION DEVICE

TECHNICAL FIELD

The present invention relates to an earthquake estimation method, an earthquake estimation program, and an earthquake estimation device.

BACKGROUND ART

The estimation of the scale (magnitude) of an earthquake is the most important fundamental information that has to be acquired after the occurrence of the earthquake. Conventionally, the estimation of a magnitude is performed according to an empirical equation on the basis of the maximum amplitude of seismic waves and distances to a hypocenter at respective observation points on the ground after reading the arrival times of the P (Primary) waves and S (Secondary) waves of the seismic waves and determining the position of the hypocenter (the position of the epicenter and the depth of the earthquake) of an earthquake by using the read arrival times. In such technology, it is necessary to accurately read the arrival times of seismic waves at a plurality of observation points. Further, there are various empirical equations as to which type of magnitude is to be used, depending on what time the maximum amplitude of seismic waves is read and which seismic wave is read to find the maximum amplitude. Among the equations, a method using a moment magnitude (Mw) allows the physical estimation of the magnitude of an earthquake, whereby the value of a magnitude increases in proportion to the magnitude of the earthquake. Therefore, it has been recommended that the Mw be used to estimate the magnitude of an earthquake.

CITATION LIST

Patent Literature

[PTL 1] Japanese Patent Application Laid-open No. H11-64553

SUMMARY OF INVENTION

Technical Problem

Since the surface waves of an earthquake are used to estimate the moment magnitude (Mw) of the earthquake, it is difficult to promptly estimate the Mw. Further, in a conventional method, it is assumed that seismic waves to be read at observation points on the ground after the occurrence of an earthquake are generated from one earthquake, hence, it is difficult to handle seismic waves when two or more earthquakes occur simultaneously. Actually, in the Earthquake Early Warning managed by Japan Meteorological Agency on the basis of such a method, two earthquakes that occurred off the coast of Ibaraki prefecture and in the west of Toyama prefecture almost simultaneously on Jan. 5, 2018, for example, were falsely dealt with as the same huge earthquake, which in turn brought about a situation where the Earthquake Early Warning was falsely issued to the Kanto district and Fukushima prefecture. Hence, it is demanded that, even in a case in which two or more earthquakes occur simultaneously as described above, the number of earthquakes, the magnitude of an earthquake, or the like be estimated promptly and accurately.

The present invention has an object of providing an earthquake estimation method for more promptly estimating an earthquake on the basis of observation data.

Solution to Problem

A disclosed technology employs the following means in order to solve the above problem.

That is, a first aspect provides an earthquake estimation method including, by a computer:

generating an observation image showing a spatial distribution of seismic wave propagation on a basis of an observation result of seismic waves at a plurality of observation points on a ground; and estimating a parameter of an earthquake with respect to the observation image by using an earthquake estimation model in which a parameter of an earthquake including at least a position of a hypocenter and a magnitude is associated with a simulated observation image showing a spatial distribution of seismic wave propagation on a ground obtained from a result of a numerical simulation of the earthquake, performed with the parameter.

According to the first aspect, the parameter of an earthquake is estimated from the spatial distribution of seismic wave propagation by using an earthquake estimation model based on the numerical simulation of an earthquake.

Further, a second aspect provides the earthquake estimation method, wherein the earthquake estimation model is constructed as a model that performs machine learning by using, as teacher data, a set of the parameter of the earthquake and the simulated observation image to estimate respective parameters of an earthquake.

According to the second aspect, an earthquake estimation model is constructed by machine learning by using, as teacher data, an earthquake parameter and a simulated observation image.

Further, a third aspect provides the earthquake estimation method, wherein the simulated observation image is an image showing a spatial distribution of seismic wave propagation on a ground obtained from a result of a numerical simulation of a parameter of one or a plurality of earthquakes, the earthquake estimation model is constructed as a model that performs machine learning by using, as teacher data, a set of the simulated observation image and the number of earthquakes used, when generating the simulated observation image, to estimate the number of earthquakes, and the computer estimates the number of earthquakes with respect to the observation image by using the earthquake estimation model.

According to the third aspect, the number of earthquakes in an observation image is estimated on the basis of an earthquake estimation model for estimating the number of earthquakes.

The disclosed aspects may be realized in such a manner that a program is performed by an information processing device. That is, the disclosed configurations can be specified as a program for causing an information processing device to perform processing performed by respective means in the above aspects or a computer-readable recording medium on which the program is recorded. Further, the disclosed configurations may be specified as a method in which an information processing device performs the processing performed by the above respective means. The disclosed configurations may be specified as a system including an information processing device that performs the processing performed by the above respective means.

Advantageous Effects of Invention

According to the present invention, an earthquake estimation method for more promptly estimating an earthquake on the basis of observation data can be provided.

DESCRIPTION OF EMBODIMENTS

Hereinafter, an embodiment will be described with reference to the drawings. The configuration of the embodiment is given for exemplification, and the disclosed configuration is not limited to the specific configuration of the disclosed embodiment. In carrying out the disclosed configuration, a specific configuration corresponding to the embodiment may be appropriately employed.

EMBODIMENT

Configuration Example

Figure 1:
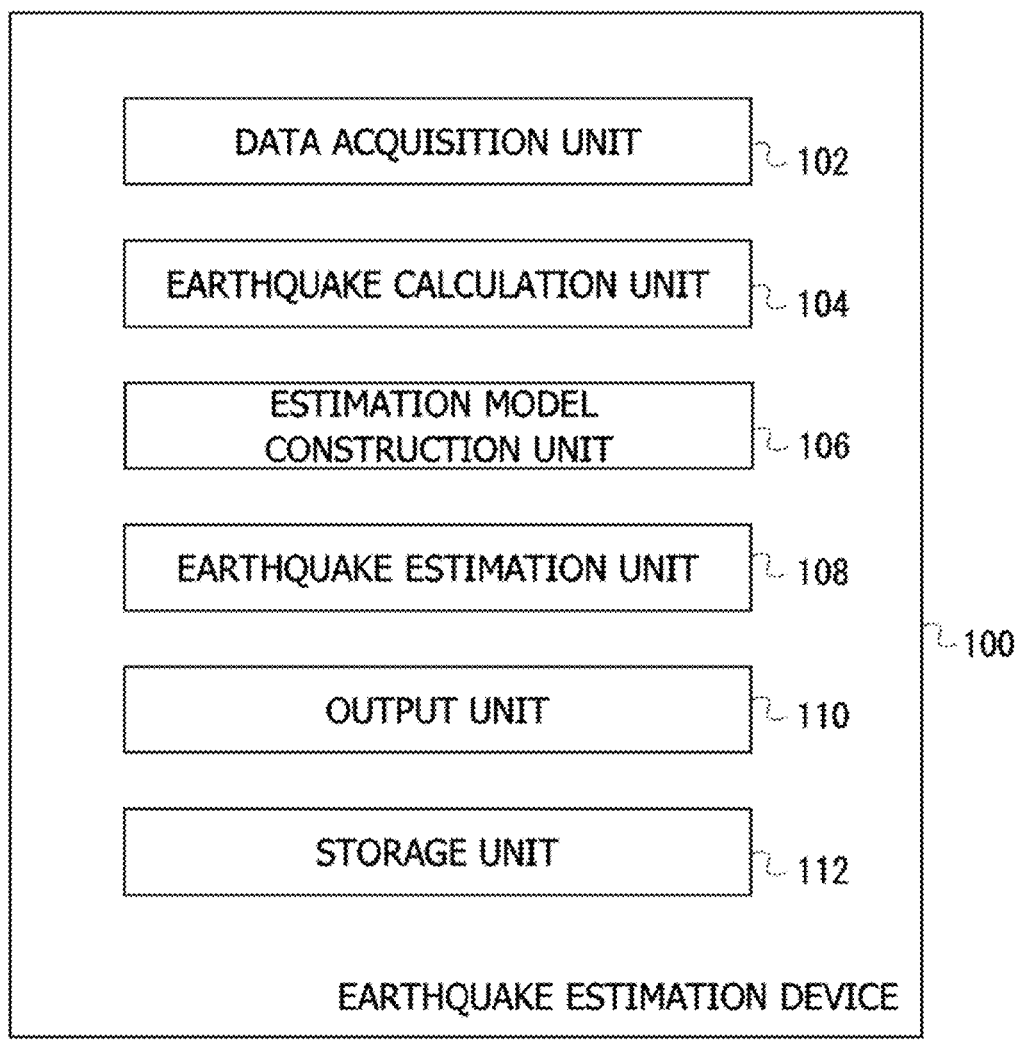
FIG. 1 is a diagram showing a function block configuration example of an earthquake estimation device according to an embodiment.

FIG. 1 is a diagram showing a function block configuration example of an earthquake estimation device according to the present embodiment. An earthquake estimation device 100 includes a data acquisition unit 102, an earthquake calculation unit 104, an estimation model construction unit 106, an earthquake estimation unit 108, an output unit 110, and a storage unit 112.

The data acquisition unit 102 acquires data that is to be used in the numerical simulation of an earthquake in the earthquake calculation unit 104, the construction of an earthquake estimation model in the estimation model construction unit 106, the estimation of an earthquake in the earthquake estimation unit 108, or the like from other devices or the storage unit 112. The data acquisition unit 102 acquires, for example, observation data on seismic waves (such as the positions of observation points, observation times, displacements, speeds, and acceleration) observed by seismometers installed at observation points in a prescribed area via a network or the like. On the basis of the acquired observation data on the actual seismic waves, the data acquisition unit 102 generates an observation image showing the displacements of the respective points in the prescribed area. The observation image includes an observation static image and an observation moving image. In the observation static image, the displacements of the respective points on the ground are converted into colors and shown on a map. In the observation static image, the displacements of points at which observation points are not set are determined by, for example, the insertion of the displacements of surrounding observation points. The data acquisition unit 102 may generate an observation static image at a prescribed time interval until the elapse of a second prescribed time (>a first prescribed time) since the occurrence of an earthquake (or after the elapse of the first prescribed time since the occurrence of the earthquake). Further, the data acquisition unit 102 may arrange observation static images generated at a prescribed time interval in order of time to generate an observation moving image. The use of a moving image including a plurality of static images further improves the estimation of an earthquake and accuracy in estimating the number of earthquakes. An observation image showing the displacements of respective points in a prescribed area is an example of an image showing the spatial distribution of seismic wave propagation in the prescribed area. The data acquisition unit 102 stores a generated observation image in the storage unit 112. Further, the data acquisition unit 102 may generate two-dimensional array data on the displacements of the ground instead of an observation image. In the two-dimensional array data, respective subscripts correspond to the positions of the ground, and respective elements correspond to displacements. Further, the data acquisition unit 102 acquires underground structure data showing an underground structure, data on a simulated earthquake, or the like that is to be used in the calculation of an earthquake from the storage unit 112 or the like. Instead of the displacements of respective points, speeds or acceleration may be used.

The earthquake calculation unit 104 performs the numerical simulation of an earthquake on the basis of an underground structure, earthquake data on the earthquake, or the like. According to the numerical simulation of an earthquake, the earthquake calculation unit 104 calculates the displacements of respective points on the ground or the like in a prescribed area until the elapse of a prescribed time since the occurrence of the earthquake and converts the displacements of the respective points into colors to generate a simulated observation image shown on a map. For example, the values of displacements increase as the colors of the displacements changes from black to white. The simulated observation image is an image simulating an observation image. The simulated observation image includes a simulated observation static image and a simulated observation moving image. The displacements of the respective points on the ground change with time. The earthquake calculation unit 104 generates simulated observation static images at one or more times in a time range (until the elapse of a prescribed time since the occurrence of an earthquake) in which the numerical simulation of the earthquake is performed. In the simulated observation static images, the displacements of respective points on the ground are shown. The earthquake calculation unit 104 may generate simulated observation static images at a prescribed time interval in the time range. The earthquake calculation unit 104 may arrange the simulated observation static images generated at the prescribed time interval in order of time to generate a simulated observation moving image. Further, the earthquake calculation unit 104 may generate two-dimensional array data on the displacements of the ground instead of simulated observation images. In the two-dimensional array data, respective subscripts correspond to the positions of the ground, and respective elements correspond to displacements. Further, the earthquake calculation unit 104 performs a simulation in a case in which a plurality of earthquakes occur almost simultaneously, and generates a simulated observation image about the plurality of earthquakes.

The estimation model construction unit 106 constructs an earthquake estimation model for estimating respective parameters from an observation image, using a set of a simulated observation image generated by the earthquake calculation unit 104 and respective parameters on earthquake data used to generate the simulated observation image as teacher data. The earthquake estimation model is constructed for each of the parameters of an earthquake.

On the basis of an observation image based on observation, the earthquake estimation unit 108 estimates the number of earthquakes or the respective parameters of an earthquake about the observation image using an earthquake estimation model for estimating respective parameters or the like constructed by the estimation model construction unit 106.

The output unit 110 outputs calculation results or the like calculated by respective constituting units to a display device or the like.

The storage unit 112 stores observation data on seismic waves acquired from observation points or the like, calculation results or the like calculated by respective constituting units, data showing an underground structure, earthquake data on a simulated earthquake, or the like.

The earthquake estimation device 100 is realizable by using a dedicated or general-purpose computer such as a WS (Work Station), a PC (Personal Computer), a smart phone, a mobile phone, a tablet terminal, a car navigation system, a PDA (Personal Digital Assistant), or an electronic apparatus equipped with a computer. The earthquake estimation device 100 is realizable by using a computer (server apparatus) that provides a service via a network. The earthquake estimation device 100 is realizable by a calculator that performs parallelization through an MPI (Message Passing Interface) in which CPUs or GPUs are arranged in a line on a large magnitude.

Figure 2:
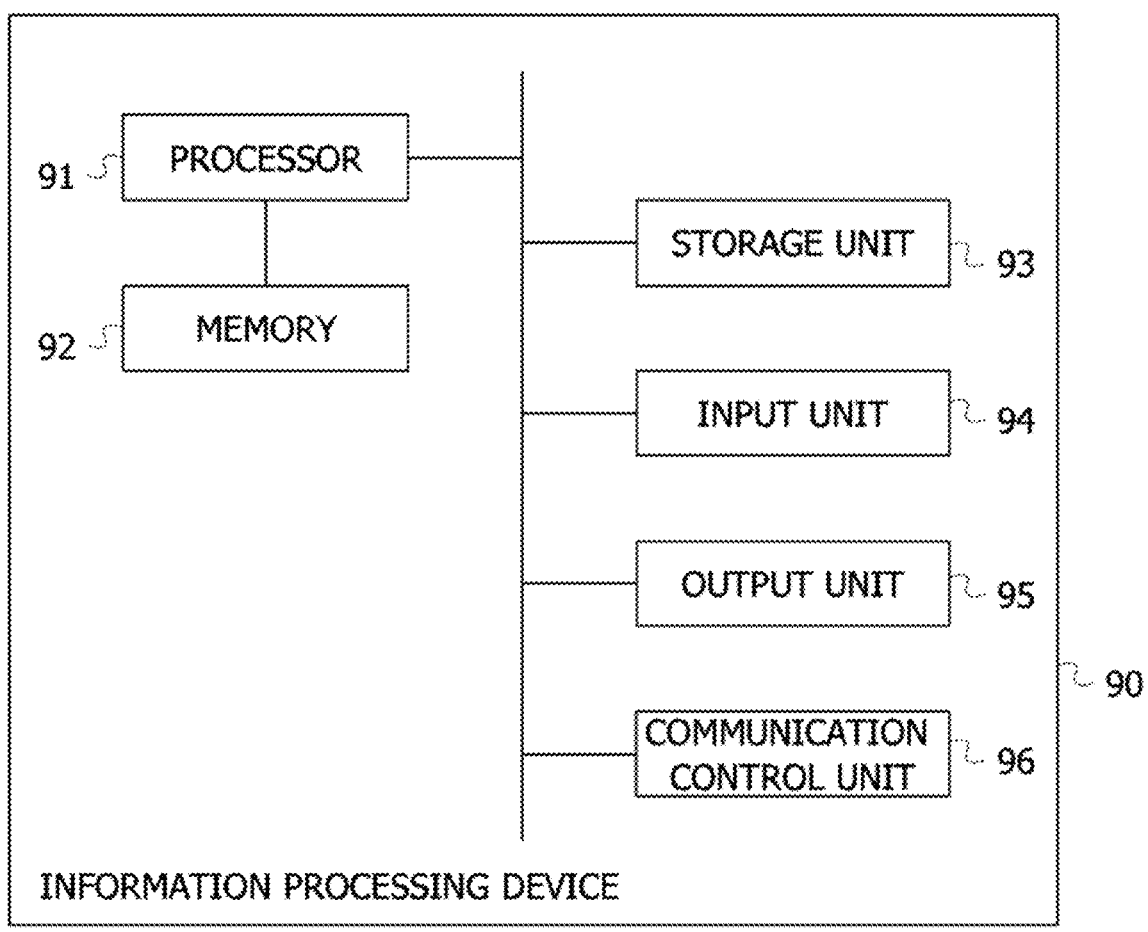
FIG. 2 is a diagram showing a hardware configuration example of an information processing device.

FIG. 2 is a diagram showing a hardware configuration example of an information processing device. An information processing device 90 shown in FIG. 2 has a general computer configuration. The earthquake estimation device 100 is realized by using the information processing device 90 as shown in FIG. 2. The information processing device 90 of FIG. 2 has a processor 91, a memory 92, a storage unit 93, an input unit 94, an output unit 95, and a communication control unit 96. These units are connected to each other by a bus. The memory 92 and the storage unit 93 are computer-readable recording media. The hardware configuration of the information processing device is not limited to the example shown in FIG. 2, but constituting elements may be appropriately omitted, replaced, or added.

The information processing device 90 can realize a function matching a prescribed goal when the processor 91 loads a program stored in a recording medium into the work area of the memory 92 and respective constituting units or the like are controlled by the running of the program.

The processor 91 is, for example, a CPU (Central Processing Unit), a DSP (Digital Signal Processor), or a GPGPU (General-Purpose computing on Graphics Processing Units).

The memory 92 includes, for example, a RAM (Random Access Memory) or a ROM (Read Only Memory). The memory 92 is also called a main storage device.

The storage unit 93 is, for example, an EPROM (Erasable Programmable ROM) or an HDD (Hard Disk Drive). Further, the storage unit 93 can include a removable medium, that is, a transportable recording medium. The removable medium is, for example, a USB (Universal Serial Bus) memory or a disk recording medium such as a CD (Compact disc) and a DVD (Digital Versatile Disc). The storage unit 93 is also called a secondary storage device.

The storage unit 93 stores various programs, various data, and various tables that are to be used in the information processing device 90 in a recording medium so as to be freely readable and writable. In the storage unit 93, an OS (Operating System), various programs, various tables, or the like are stored. Information stored in the storage unit 93 may be stored in the memory 92. Further, information stored in the memory 92 may be stored in the storage unit 93.

The OS is software for performing the mediation between software and hardware, memory space management, file management, process or task management, or the like. The OS includes a communication interface. The communication interface is a program for exchanging data with other external devices or the like connected via the communication control unit 96. The external devices or the like include, for example, other information processing devices, external storage devices, or the like.

The input unit 94 includes a keyboard, a pointing device, a wireless remote controller, a touch panel, or the like. Further, the input unit 94 can include a video or image input device such as a camera or a sound input device such as a microphone.

The output unit 95 includes a display device such as an LCD (Liquid Crystal Display), an EL (Electroluminescence) panel, a CRT (Cathode Ray Tube) display, and a PDP (Plasma Display Panel) and an output device such as a printer. Further, the output unit 95 can include a sound output device such as a speaker.

The communication control unit 96 is connected to other devices and controls the communication between the information processing device 90 and other devices. The communication control unit 96 is, for example, a LAN (Local Area Network) interface board, a wireless communication circuit for wireless communication, or a communication circuit for wired communication. The LAN interface board or the wireless communication circuit is connected to a network such as the Internet.

Steps describing a program include, besides processing chronologically performed along a described order, processing that is not necessarily chronologically processed but is performed in parallel or separately. A part of the steps describing the program may be omitted.

A series of processing can be performed by the hardware or software. The constituting elements of the hardware are hardware circuits and include, for example, a FPGA (Field Programmable Gate Array), an ASIC (Application Specific Integrated Circuit), a gate array, a combination of logic gates, an analog circuit, or the like.

Operation Example

<Numerical Simulation of Earthquake>

Figure 3:
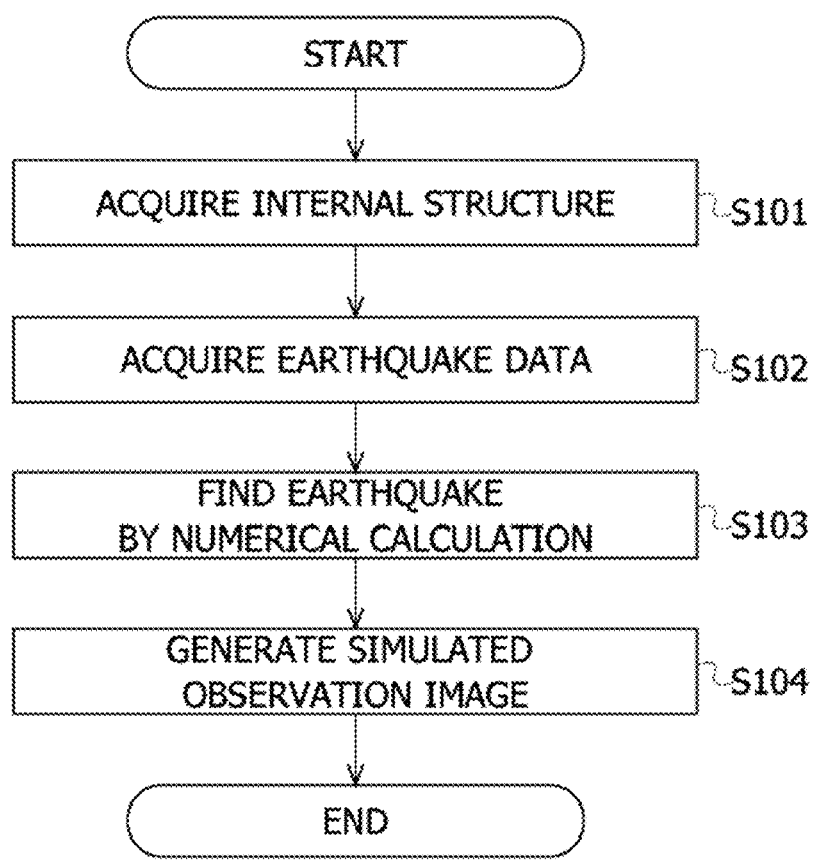
FIG. 3 is a diagram showing an operation flow example of the numerical simulation of an earthquake by an earthquake estimation device.

FIG. 3 is a diagram showing an operation flow example of the numerical simulation of an earthquake by the earthquake estimation device. The earthquake estimation device 100 assumes various earthquakes to perform the numerical simulation of an earthquake and generates a simulated observation image showing the spatial distribution (for example, the displacements of the surface of the ground) of seismic wave propagation in a prescribed area. The earthquake estimation device 100 also assumes a plurality of earthquakes occurring almost simultaneously and generates a simulated observation image based on a plurality of earthquakes. Here, two earthquakes will be assumed as a plurality of earthquakes in the following description, but three or more earthquakes may be assumed.

In S101, the data acquisition unit 102 of the earthquake estimation device 100 acquires data that is to be used in the simulation of an earthquake. The data acquisition unit 102 acquires the respective data on the densities of respective underground areas showing the underground structure of the earth, a P-wave speed, and an S-wave speed (the spatial distribution of the underground structure) that are stored in the storage unit 112. Further, the data acquisition unit 102 acquires data showing the shape of the ground and data showing the attenuation structure of the underground that are stored in the storage unit 112. The data acquisition unit 102 may acquire these data from other devices via a network or the like.

In S102, the data acquisition unit 102 acquires earthquake data on an assumed earthquake that is stored in the storage unit 112. The earthquake data is the position (the latitude and longitude) of the epicenter of the earthquake, the depth of an earthquake, a magnitude (moment magnitude), and a moment tensor showing the direction of fault movement or the like. A combination of the position of the epicenter and the depth of the earthquake is also called the position of the hypocenter. The earthquake can be specified by the respective parameters of the earthquake data. The data acquisition unit 102 may acquire these data from other devices via a network or the like.

In S103, the earthquake calculation unit 104 performs the numerical simulation (numerical calculation) of the earthquake with the known motion equation of elastic waves, using the data on the underground structure acquired in S101 and the earthquake data acquired in S102 as initial values. The motion equation of elastic waves is an equation with which a temporal change in the displacements of the respective points on the surface of the ground can be calculated from the data on the underground structure, the earthquake data showing the earthquake, the data showing the shape of the ground, and the data showing the attenuation structure of the underground. The data on the underground structure is expressed by the respective parameters of the densities of the respective points of the underground, a P-wave speed, and an S-wave speed. Further, the earthquake data is expressed by the respective parameters of the magnitude, the position of the epicenter, the depth of the earthquake, and the moment tensor. Instead of these parameters, other parameters equivalent to these parameters may be used. In a calculation area in which the numerical simulation is performed, respective data on points at which the data on the underground structure, the data showing the shape of the ground, and the data showing the attenuation structure of the underground do not exist may be interpolated by the insertion of the respective data of surrounding points at which the data exists. Assuming that an earthquake occurrence time (occurrence time) is expressed as t=0, the earthquake calculation unit 104 calculates the displacements of the respective points on the surface of the ground in a prescribed area until the elapse of a prescribed time. A time interval at which the calculation of the displacements is discretely performed is set according to simulation accuracy. Here, a displacement direction is, for example, a vertical direction. The displacement direction is not limited to the vertical direction but may be a horizontal direction. It is generally considered that the displacements in the vertical direction cause less noise in the observation of seismic waves. Therefore, the displacements in the vertical direction are suitable for the comparison between the numerical simulation of the earthquake and observation data. The earthquake calculation unit 104 stores the calculated result of the numerical simulation in the storage unit 112.

In S104, the earthquake calculation unit 104 generates, for the earthquake calculated in S103, a simulated observation static image in which the displacements of the respective points at respective times are expressed by colors or a simulated observation moving image in which the simulated observation static images are sequentially connected to each other in the map of a prescribed area during a period until the elapse of a prescribed time since the occurrence of the earthquake. A time interval at which the simulated observation static image is generated is set according to simulation accuracy. The simulated observation static image and the simulated observation moving image will be collectively called a simulated observation image. For example, the values of displacements increase as the colors of the displacements change from black to white. The earthquake calculation unit 104 stores the generated simulated observation image in the storage unit 112 so as to be associated with the earthquake data and an elapsed time since the occurrence of the earthquake. When generating the simulated observation image, the earthquake calculation unit 104 may insert the result of a surrounding position at which the result of the numerical simulation exists to interpolate a result for a position at which the result of the numerical simulation does not exist.

Further, when performing the numerical simulation of two earthquakes occurring almost simultaneously in the earthquake estimation device 100, the data acquisition unit 102 acquires earthquake data on the two earthquakes in S101. The earthquakes occurring almost simultaneously refer to, for example, earthquakes that occur with a time difference within 30 seconds. The time difference can be changed according to, for example, the size or the like of a prescribed area for which a simulated observation image is generated. Further, in S103, the earthquake calculation unit 104 changes the difference (the occurrence time of a first earthquake−the occurrence time of a second earthquake) between times (occurrence times), at which the two earthquakes (assumed as the first earthquake and the second earthquake) occur, in seconds from −30 seconds to +30 seconds and performs the numerical simulation of each of the earthquakes. Further, in S104, the earthquake calculation unit 104 generates a simulated observation image for the numerical simulations of the respective earthquakes and stores the same in the storage unit 112.

When generating a simulated observation image for one earthquake, the earthquake calculation unit 104 stores the simulated observation image and the number (one) of earthquakes in the storage unit 112 so as to be associated with each other. Further, when generating a simulated observation image for two earthquakes occurring almost simultaneously, the earthquake calculation unit 104 stores the simulated observation image and the number (two) of earthquakes in the storage unit 112 so as to be associated with each other.

The earthquake estimation device 100 performs the numerical simulation of an earthquake according to the operation flow of FIG. 3 for an earthquake that could possibly occur in view of the observation result of past seismic waves, the geological structure of the underground, or the like and could be observed in a prescribed area. Further, when two arbitrary earthquakes among the earthquakes occur almost simultaneously, the earthquake estimation device 100 performs the numerical simulation of the earthquakes.

Figures 4A, 4B:
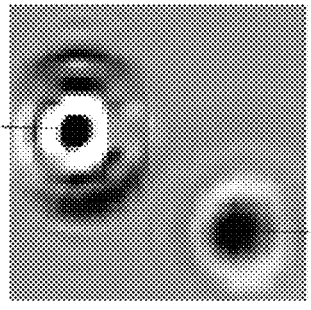
FIGS. 4A to 4D are diagrams each showing an example of a simulated observation image generated by the earthquake estimation device.
Figure 4C:
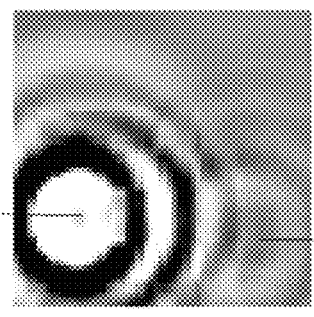
Figure 4D:

FIGS. 4A to 4D are diagrams each showing an example of a simulated observation static image generated by the earthquake estimation device. Each of FIGS. 4A and 4B shows a simulated observation static image generated for one earthquake. Each of FIGS. 4C and 4D shows a simulated observation static image generated for two earthquakes that occurred almost simultaneously. The respective simulated observation static images of FIGS. 4A to 4D show the displacements of respective positions on the surface of the ground in a prescribed area. Here, in the respective images, it is assumed that the values of the displacements increase as the colors of the displacements change from black to white. Further, in the respective images, the displacements of gray portions are zero. In the respective images of FIGS. 4A and 4B, the epicenter of the earthquake set in a numerical simulation is shown. In the respective images of FIGS. 4C and 4D, the two epicenters of the two earthquakes (a first earthquake and a second earthquake) set in a numerical simulation are shown. In the respective simulated observation static images of FIGS. 4A to 4D, it appears that the levels of the displacements spread concentrically about the epicenters of the respective earthquakes.

<Construction of Earthquake Estimation Model for Estimating the Number of Earthquakes>

Figure 5:
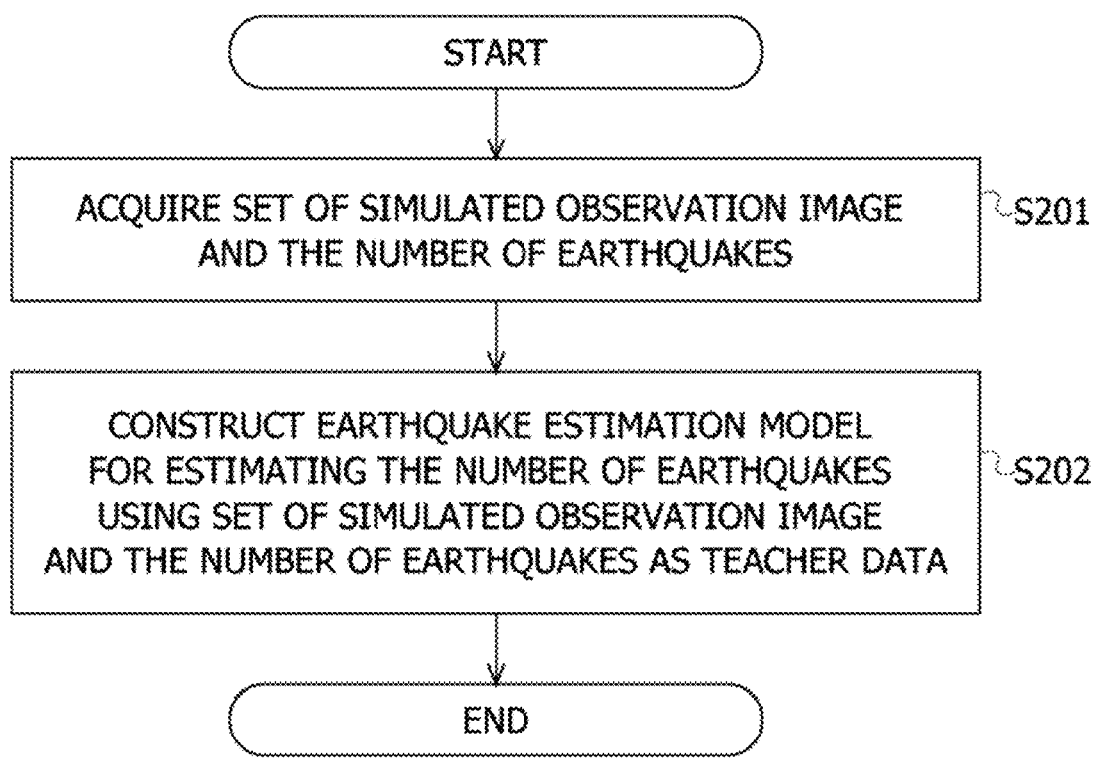
FIG. 5 is a diagram showing an operation flow example of the construction of an earthquake estimation model for estimating the number of earthquakes by the earthquake estimation device.

FIG. 5 is a diagram showing an operation flow example of the construction of an earthquake estimation model for estimating the number of earthquakes by the earthquake estimation device. The earthquake estimation device 100 constructs an earthquake estimation model for estimating the number of earthquakes from an observation image with the deep learning model of machine learning, using a set of a simulated observation image generated on the basis of the numerical simulation of an earthquake and the number of earthquakes as teacher data.

In S201, the data acquisition unit 102 of the earthquake estimation device 100 acquires a simulated observation image stored in the storage unit 112 and the number of earthquakes associated with the simulated observation image from the storage unit 112.

In S202, the estimation model construction unit 106 constructs an earthquake estimation model for estimating the number of earthquakes from a simulated observation image (observation image) with the deep learning model of machine learning, using a set of the simulated observation image and the number of the earthquakes acquired in S201 as teacher data. As the deep learning model used here, any model may be used. The estimation model construction unit 106 stores the constructed earthquake estimation model for estimating the number of earthquakes in the storage unit 112. In the construction of the model, a method using learning space such as deep learning based on a neural network, a multiple regression analysis, and Look up Table or the like can be used. In the construction of the earthquake estimation model, a method other than the machine learning may be used.

<Construction of Estimation Model for Estimating Parameters of Earthquake>

Figure 6:
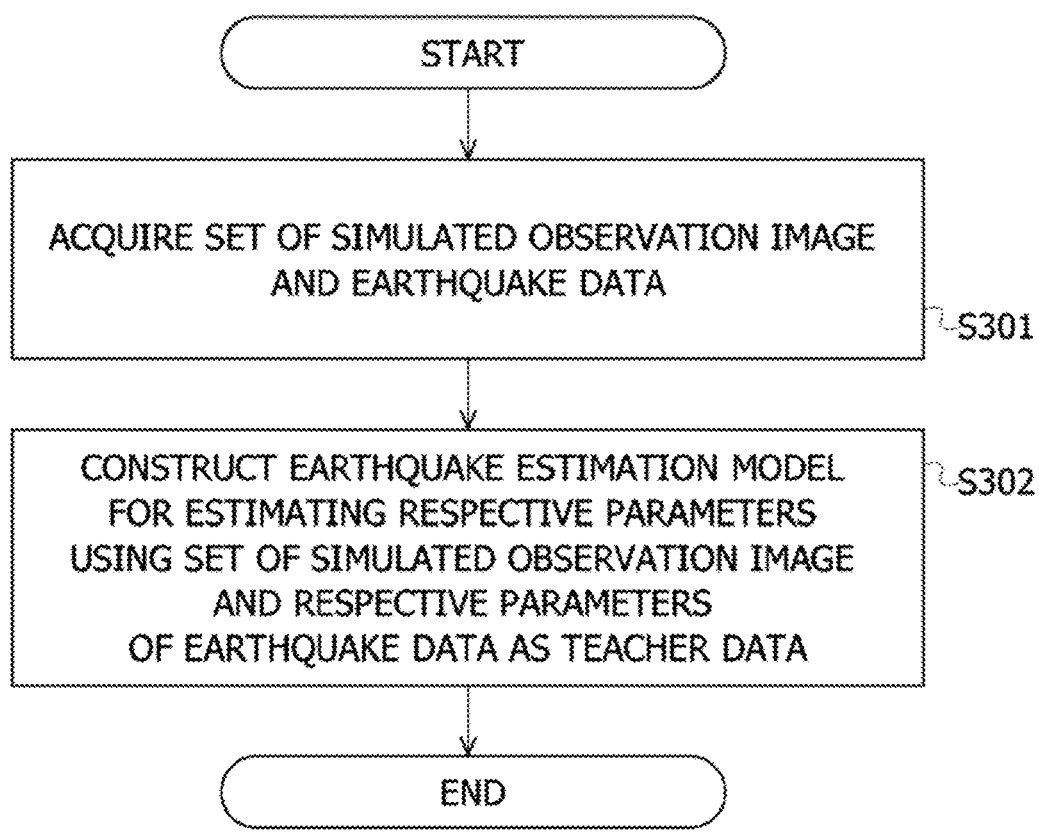
FIG. 6 is a diagram showing an operation flow example of the construction of an earthquake estimation model for estimating the parameters of an earthquake by the earthquake estimation device.

FIG. 6 is a diagram showing an operation flow example of the construction of an earthquake estimation model for estimating the parameters of an earthquake by the earthquake estimation device. The earthquake estimation device 100 constructs an earthquake estimation model for estimating the respective parameters of an earthquake from an observation image with the deep learning model of machine learning, using a set of a simulated observation image generated on the basis of the simulation of an earthquake and the respective parameters of earthquake data used to generate the simulated observation image as teacher data.

In S301, the data acquisition unit 102 of the earthquake estimation device 100 acquires a simulated observation image stored in the storage unit 112 and the respective parameters of an earthquake used to generate the simulated observation image from the storage unit 112. Further, the data acquisition unit 102 also acquires an elapsed time since the occurrence of the earthquake and the number of earthquakes that are associated with the simulated observation image. Here, it is assumed that the elapsed time since the occurrence of the earthquake is also one of the parameters of the earthquake.

In S302, the estimation model construction unit 106 constructs an earthquake estimation model for estimating the respective parameters of the earthquake from the simulated observation image (observation image) with the deep learning model of machine learning, using a set of the simulated observation image and the respective parameters of the earthquake acquired in S301 as teacher data. Here, the estimation model construction unit 106 constructs an earthquake estimation model for each of the parameters of the earthquake and for each of the number of earthquakes. The parameters of the earthquake include a magnitude (moment magnitude), the position (latitude and longitude) of an epicenter, the depth of an earthquake, an elapsed time since the occurrence of the earthquake, and a moment tensor (six components). For example, the estimation model construction unit 106 constructs an earthquake estimation model for estimating the magnitude of an earthquake from an observation image in which the number of earthquakes is one. As the parameters of the earthquake, other parameters may be used. The deep learning model used here may be any model. The estimation model construction unit 106 stores the constructed earthquake estimation model for estimating the respective parameters of the earthquake in the storage unit 112. In the construction of the model, a method using learning space such as deep learning based on a neural network, a multiple regression analysis, and Look up Table or the like can be used. In the construction of the earthquake estimation model, a method other than the machine learning may be used.

<Estimation of Earthquake>

Figure 7:
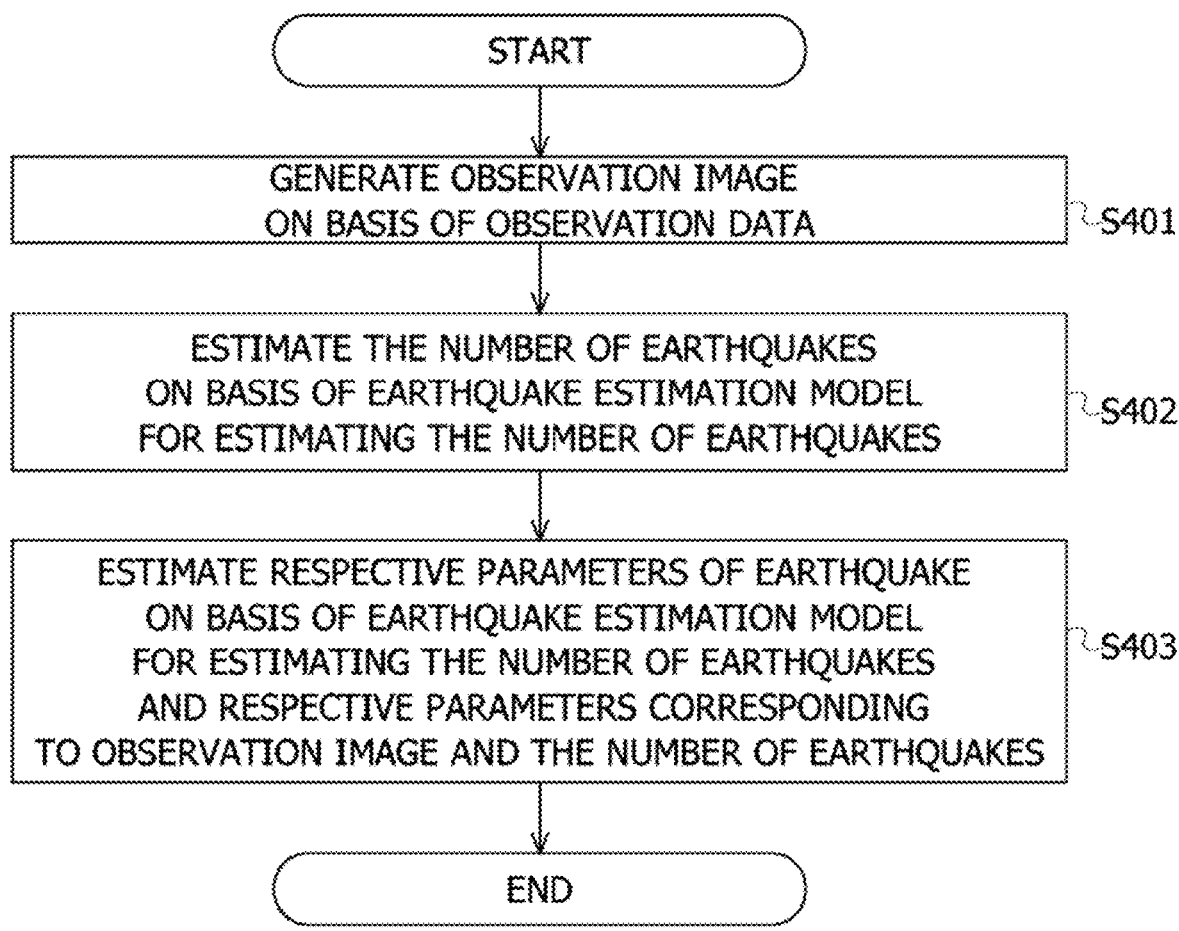
FIG. 7 is a diagram showing an operation flow example of the estimation of an earthquake by the earthquake estimation device.

FIG. 7 is a diagram showing an operation flow example of estimating an earthquake by the earthquake estimation device. The earthquake estimation device 100 acquires observation data on an earthquake from respective observation points and performs the estimation of the number of earthquakes or the respective parameters of the earthquake using a constructed earthquake estimation model.

In S401, the data acquisition unit 102 of the earthquake estimation device 100 acquires observation data (such as displacements, speeds, and acceleration) or the like on seismic waves observed by seismometers installed at observation points in a prescribed area via a network or the like. On the basis of the acquired observation data on the actual seismic waves, the data acquisition unit 102 generates an observation static image showing the displacements of the prescribed area or an observation moving image in which the observation static images are sequentially connected to each other for each of the times (observation times) at which the displacements were observed. The observation static image and the observation moving image will be collectively called an observation image. The observation image includes information on the times (observation times) at which the displacements were observed. The observation times are recorded as, for example, dates and total seconds since 00:00 A.M. on the dates. When generating the observation image, the data acquisition unit 102 may insert observation data on a surrounding position at which the observation data exists to interpolate the observation data for a position at which the observation data does not exist. The data acquisition unit 102 stores the generated observation image in the storage unit 112. The data acquisition unit 102 may generate an observation image on the condition that displacements by a prescribed value or more are observed at a prescribed number or more observation points. When the displacements are observed only at a small number of observation points or when only the displacements by a prescribed value or less are observed, it is highly likely that displacements are not due to an earthquake but are due to a noise, hence, the data acquisition unit 102 does not have to generate an observation image. The data acquisition unit 102 may or may not combine a time interval at which an observation static image is generated with a time interval at which a simulated observation static image is generated.

In S402, the earthquake estimation unit 108 estimates the number of earthquakes included in the observation image on the basis of the observation image generated in S401, using an earthquake estimation model for estimating the number of earthquakes that is constructed by a simulated observation image. The earthquake estimation unit 108 stores the estimated number of the earthquakes in the storage unit 112 so as to be associated with the observation image.

In S403, the earthquake estimation unit 108 estimates the respective parameters of the earthquake corresponding to the observation image on the basis of the observation image generated in S401, using an earthquake estimation model for estimating the respective parameters of the earthquake that is constructed by the simulated observation image. The earthquake estimation unit 108 estimates the respective parameters of the earthquake on the basis of the observation image generated in S401, using an earthquake estimation model for estimating respective parameters corresponding to the number of the earthquakes estimated in S402. Thus, the earthquake estimation unit 108 can estimate the magnitude of the earthquake, the position of an epicenter, the depth of an earthquake, the occurrence time, and the moment tensor that correspond to the observation image. The occurrence time of the earthquake can be calculated by subtracting an estimated elapsed time since the occurrence of the earthquake from a time at which a displacement was observed in the observation image. The earthquake estimation unit 108 stores the estimated magnitude of the earthquake, the position of the epicenter, the depth of the earthquake, the occurrence time, and the moment tensor in the storage unit 112. When the observation image includes a plurality of earthquakes, the earthquake estimation unit 108 estimates earthquake data (the magnitude, the position of an epicenter, the depth of an earthquake, an occurrence time, and a moment tensor) on each of the earthquakes and stores the same in the storage unit 112. The output unit 110 outputs the earthquake data stored in the storage unit 112 to a display device or the like. For example, when it is assumed that the number of earthquakes is one, the earthquake estimation unit 108 uses an earthquake estimation model for estimating the respective parameters of an earthquake that is constructed by the one earthquake. The use of an earthquake estimation model for each of earthquakes improves earthquake estimation accuracy. For sequential observation static images at a plurality of times, the earthquake estimation unit 108 may estimate each of the respective parameters of an earthquake, assume that the parameters belong to the same earthquake, and average each of the estimated respective parameters of the earthquake at the plurality of times to calculate the respective parameters of the earthquake. When an earthquake estimation model is constructed by a simulated observation static image, the earthquake estimation device 100 estimates the number of earthquakes or the respective parameters of an earthquake using an observation static image. When an earthquake estimation model is constructed by a simulated observation moving image, the earthquake estimation device 100 estimates the number of earthquakes or the respective parameters of an earthquake using an observation moving image. The earthquake estimation device 100 may use an observation static image and a simulated observation static image or use an observation moving image and a simulated observation moving image as an observation image and a simulated observation image that are used to perform the construction of respective earthquake estimation models, the estimation of the number of earthquakes, and the estimation of the respective parameters of an earthquake.

(Other)

In the above example, an earthquake estimation model for estimating the number of earthquakes is constructed, and an earthquake estimation model for estimating the respective parameters of an earthquake for each of the number of earthquakes is constructed. When an earthquake estimation model for estimating the respective parameters of an earthquake is constructed, the earthquake estimation model may be constructed by a simulated observation image based on one earthquake and a simulated observation image based on a plurality of earthquakes. In this case, the earthquake estimation device 100 may not first perform the step of estimating the number of earthquakes when estimating an earthquake from an observation image, and can more promptly perform the estimation of earthquake data on the earthquake by estimating together the number of earthquakes included in the observation image and the respective parameters of the earthquake data on the earthquake.

The numerical simulation of an earthquake may be performed by a device other than the earthquake estimation device 100. At this time, the data acquisition unit 102 of the earthquake estimation device 100 acquires a simulated observation image from the other device that has generated the simulated observation image according to the numerical simulation of the earthquake via a network or the like.

Function and Effect of Embodiment

The earthquake estimation device 100 performs the numerical simulation of an earthquake on the basis of data on an underground structure and estimated earthquake data on an earthquake and generates a simulated observation image showing the displacements of a prescribed area. The earthquake estimation device 100 performs the numerical simulation of an earthquake(s) when one or a plurality of earthquakes occur. The earthquake estimation device 100 stores a generated simulated observation image, the number of earthquakes included in earthquake data and the simulated observation image, and the earthquake data on the earthquake so as to be associated with each other. The earthquake estimation device 100 constructs an earthquake estimation model for estimating the number of earthquakes, using a set of a simulated observation image and the number of earthquakes as teacher data. Further, the earthquake estimation device 100 constructs an earthquake estimation model for estimating the respective parameters of an earthquake for each of the number of earthquakes, using a set of a simulated observation image and earthquake data as teacher data.

Further, the earthquake estimation device 100 generates an observation image showing the displacements of the surface of the ground at respective points in a prescribed area from observation data on seismic waves. On the basis of the observation image, the earthquake estimation device 100 estimates the number of earthquakes included in the observation image, using an earthquake estimation model for estimating the number of earthquakes. On the basis of the estimated number of the earthquakes and the observation image, the earthquake estimation device 100 estimates the respective parameters of an earthquake, using an earthquake estimation model for estimating the respective parameters of an earthquake for each of the number of earthquakes. According to the earthquake estimation device 100, the number of earthquakes is estimated, and the respective parameters of earthquake data on an earthquake are estimated on the basis of an observation image generated by observation data on seismic waves. Thus, the magnitude of an earthquake, the position of a hypocenter, or the like can be promptly calculated. According to the earthquake estimation device 100, earthquake data on an earthquake is estimated after the number of earthquakes is estimated in advance. Thus, a plurality of earthquakes occurring almost simultaneously can be prevented from being estimated as one huge earthquake. According to the earthquake estimation device 100, the magnitude of an earthquake, the position of a hypocenter, or the like can be more promptly estimated compared with a method in which a magnitude is estimated after the position of the hypocenter of an earthquake is estimated as in the related art. According to the earthquake estimation device 100, the magnitude of an earthquake, the position of a hypocenter, or the like is more promptly estimated, whereby the expedition or the like of the issuance of a tsunami warning can be attained.

The embodiments of the present invention are described above but are given only for exemplification. The present invention is not limited to the embodiments but is modifiable in various ways on the basis of the knowledge of persons skilled in the art within the range of the spirit of claims. Further, respective configuration examples or the like can be combined together to a greater extent to be carried out.

<Computer-Readable Recording Medium>

A program for causing a computer or other device (hereinafter, a computer or the like) to realize any of the above functions can be recorded on a recording medium readable by a computer or the like. Then, the function can be provided when the computer or the like is caused to read and perform the program of the recording medium.

Here, the recording medium readable by a computer or the like refers to a recording medium that can accumulate information such as data or a program by an electrical, magnetic, optical, mechanical, or chemical operation and read the same from a computer or the like. Such a recording medium may be provided with an element such as a CPU and a memory that constitutes a computer and cause the CPU to perform the program.

Further, as such a recording medium removable from a computer or the like, a flexible disk, a magnetic optical disk, a CD-ROM, a CD-R/W, a DVD, a DAT, an 8 mm tape, a memory card, or the like is, for example, available.

Further, as a recording medium fixed to a computer or the like, a hard disk, a ROM, or the like is available.

REFERENCE SIGNS LIST

100 Earthquake estimation device
102 Data acquisition unit
104 Earthquake calculation unit
106 Estimation model construction unit
108 Earthquake estimation unit
110 Output unit
112 Storage unit
90 Information processing device
91 Processor
92 Memory
93 Storage unit
94 Input unit
95 Output unit
96 Communication control unit

What is claimed is:

1. An earthquake estimation method comprising, by a computer:
   generating an observation image showing a spatial distribution of seismic wave propagation based on an observation result of seismic waves at a plurality of observation points on a ground; and
   estimating a parameter of an earthquake with respect to the observation image by using an earthquake estimation model in which the parameter of the earthquake including at least a position of a hypocenter and a magnitude is associated with a simulated observation image showing a spatial distribution of seismic wave propagation on the ground obtained from a result of a numerical simulation of the earthquake, performed with the parameter.

2. The earthquake estimation method according to claim 1, wherein
   the earthquake estimation model performs machine learning by using, as teacher data, a set of the parameter of the earthquake and the simulated observation image to estimate respective parameters of the earthquake.

3. The earthquake estimation method according to claim 1, wherein
   the simulated observation image shows the spatial distribution of seismic wave propagation on the ground obtained from the result of the numerical simulation of the parameter of one or more of the earthquake,
   the earthquake estimation model performs machine learning by using, as teacher data, a set of the simulated observation image and a number of earthquakes used, when generating the simulated observation image, to estimate the number of earthquakes, and
   the computer estimates the number of earthquakes with respect to the observation image by using the earthquake estimation model.

4. An earthquake estimation method comprising, by computer:
   generating an observation image showing a spatial distribution of seismic wave propagation based on an observation result of seismic waves at a plurality of observation points on a ground; and estimating a number of earthquakes with respect to the observation image by using an earthquake estimation model in which a parameter of an earthquake including at least a position of a hypocenter and a magnitude is associated with a simulated observation image showing a spatial distribution of seismic wave propagation on the ground obtained from a result of a numerical simulation of one or more of the earthquake, performed with the parameter, the earthquake estimation model performing machine learning by using, as teacher data, a set of the simulated observation image and the number of the earthquakes used, when generating the simulated observation image, to estimate the number of earthquakes.

5. A non-transitory computer readable medium storing an earthquake estimation program causing a computer to:

generate an observation image showing a spatial distribution of seismic wave propagation based on an observation result of seismic waves at a plurality of observation points on a ground; and estimate a parameter of an earthquake with respect to the observation image by using an earthquake estimation model in which a parameter of an earthquake including at least a position of a hypocenter and a magnitude is associated with a simulated observation image showing a spatial distribution of seismic wave propagation on the ground obtained from a result of a numerical simulation of the earthquake, performed with the parameter.

6. A non-transitory computer readable medium storing an earthquake estimation program causing a computer to:

generate an observation image showing a spatial distribution of seismic wave propagation based on an observation result of seismic waves at a plurality of observation points on a ground; and estimate a number of earthquakes with respect to the observation image by using an earthquake estimation model in which a parameter of an earthquake including at least a position of a hypocenter and a magnitude is associated with a simulated observation image showing a spatial distribution of seismic wave propagation on the ground obtained from a result of a numerical simulation of one or more of the earthquake, performed with the parameter, the earthquake estimation model performing machine learning by using, as teacher data, a set of the simulated observation image and the number of the earthquakes used, when generating the simulated observation image, to estimate the number of earthquakes.

7. An earthquake estimation device comprising:

a data acquisition unit that generates an observation image showing a spatial distribution of seismic wave propagation based on an observation result of seismic waves at a plurality of observation points on a ground; and an earthquake estimation unit that estimates a parameter of an earthquake with respect to the observation image by using an earthquake estimation model in which the parameter of the earthquake including at least a position of a hypocenter and a magnitude is associated with a simulated observation image showing a spatial distribution of seismic wave propagation on the ground obtained from a result of a numerical simulation of the earthquake, performed with the parameter.

8. An earthquake estimation device comprising:

a data acquisition unit that generates an observation image showing a spatial distribution of seismic wave propagation based on an observation result of seismic waves at a plurality of observation points on a ground; and an earthquake estimation unit that estimates a number of earthquakes with respect to the observation image by using an earthquake estimation model in which a parameter of an earthquake including at least a position of a hypocenter and a magnitude is associated with a simulated observation image showing a spatial distribution of seismic wave propagation on the ground obtained from a result of a numerical simulation of one or more of the earthquake, performed with the parameter, the earthquake estimation model performing machine learning by using, as teacher data, a set of the simulated observation image and the number of the earthquakes used, when generating the simulated observation image, to estimate the number of earthquakes.

\* \* \* \* \*